(12) United States Patent
Aue

(10) Patent No.: US 10,706,198 B2
(45) Date of Patent: Jul. 7, 2020

(54) METHOD AND DEVICE FOR SYNTHESIZING A CIRCUIT LAYOUT

(71) Applicant: Robert Bosch GmbH, Stuttgart (DE)

(72) Inventor: Axel Aue, Korntal-Muenchingen (DE)

(73) Assignee: Robert Bosch GmbH, Stuttgart (DE)

( * ) Notice: Subject to any disclaimer, the term of this patent is extended or adjusted under 35 U.S.C. 154(b) by 159 days.

(21) Appl. No.: 15/564,495

(22) PCT Filed: Mar. 23, 2016

(86) PCT No.: PCT/EP2016/056398
§ 371 (c)(1),
(2) Date: Oct. 5, 2017

(87) PCT Pub. No.: WO2016/169720
PCT Pub. Date: Oct. 27, 2016

(65) Prior Publication Data
US 2018/0076219 A1 Mar. 15, 2018

(30) Foreign Application Priority Data
Apr. 22, 2015 (DE) .......................... 10 2015 207 323

(51) Int. Cl.
*G06F 17/50* (2006.01)
*G03F 1/00* (2012.01)
(Continued)

(52) U.S. Cl.
CPC ................ *G06F 30/39* (2020.01); *G03F 1/00* (2013.01); *G03F 1/70* (2013.01); *G06F 30/392* (2020.01); *H01L 27/0207* (2013.01); *G03F 1/72* (2013.01)

(58) Field of Classification Search
None
See application file for complete search history.

(56) References Cited

U.S. PATENT DOCUMENTS 6,600,341 B2 * 7/2003 Bingert ............ H01L 27/11807
257/202
6,822,477 B1 * 11/2004 Bingert ............ H01L 27/11807
257/E27.108
(Continued)

FOREIGN PATENT DOCUMENTS

CN 102881588 A 1/2013

OTHER PUBLICATIONS

Anonymous, "Engineering change order—Wikipedia, the free encyclopedia", Feb. 6, 2014, XP055273254.
(Continued)

*Primary Examiner* — Leigh M Garbowski
(74) *Attorney, Agent, or Firm* — Norton Rose Fulbright US LLP; Gerard A. Messina

(57) ABSTRACT

A method for synthesizing a circuit layout, characterized by the following features: primary circuit functions are placed on the circuit layout; secondary circuit functions are placed on the circuit layout; at least one first mask is generated in such a way that the first mask reproduces the primary circuit functions and covers the secondary circuit functions when a semiconductor substrate is structured according to the circuit layout by way of the first mask; and the placement of the circuit functions takes place in such a way that at least one changed mask reproduces the primary circuit functions and the secondary circuit functions when the semiconductor substrate is structured according to the circuit layout by way of at least one second mask.

8 Claims, 2 Drawing Sheets

(51) Int. Cl.
  *G06F 30/39*   (2020.01)
  *G06F 30/392*  (2020.01)
  *G03F 1/70*    (2012.01)
  *H01L 27/02*   (2006.01)
  *G03F 1/72*    (2012.01)

(56) References Cited

U.S. PATENT DOCUMENTS

| | | | |
|---|---|---|---|
| 7,873,776 B2* | 1/2011 | Hetherington | G06F 9/3802 |
| | | | 711/5 |
| 9,335,624 B2* | 5/2016 | Lee | G03F 1/00 |
| 9,454,632 B1* | 9/2016 | Krishnamurthy | H01L 27/0207 |
| 2002/0163354 A1 | 11/2002 | Bingert et al. | |
| 2006/0004942 A1 | 1/2006 | Hetherington et al. | |
| 2008/0029786 A1 | 2/2008 | Fan | |

OTHER PUBLICATIONS

Kahng et al. "Incremental multiple-scan chain ordering for ECO flip-flop insertion", Computer-Aided Design, IEEE Press, Nov. 18, 2013, pp. 705-712, XP058036992.
International Search Report dated Jun. 7, 2016, of the corresponding International Application PCT/EP2016/056398 filed Mar. 23, 2016.

\* cited by examiner

METHOD AND DEVICE FOR SYNTHESIZING A CIRCUIT LAYOUT

FIELD

The present invention relates to a method for synthesizing a circuit layout. The present invention also relates to a corresponding device, a corresponding computer program, and a corresponding memory medium.

BACKGROUND INFORMATION

An integrated circuit (IC) is an electronic circuit applied on a semiconductor and is also referred to in professional circles as a solid-state circuit or a monolithic integrated circuit. A circuit of the generic type may be made up of a combination of several electronic semiconductor elements which are electrically connected to each other, such as transistors, diodes, and further active or passive components.

In order to make it possible to configure the circuit in the field, programmable systems of logic gates (field-programmable logic array, FPGA) are provided, with the aid of which highly diverse circuits may be implemented. German Patent Application No. DE 10 2006 049 245 A1 describes a control unit based on a FPGA, it being provided that an executable code, which is designed for carrying out one of the functions of the FPGA, is to be loaded into this FPGA.

SUMMARY

The present invention provides a method for synthesizing a circuit layout, a corresponding device, a corresponding computer program, and a corresponding memory medium.

One advantage according to the present invention is that it opens up the possibility for implementing functions which are not required for the time being, in order to be able to eventually utilize them cost-effectively as a meaningful function expansion—for example in a microcontroller—by way of a mask change and the function which is changed as a result.

The advantage in this case is that the costs for implementing the new function—which, in the ideal case, merely requires one change to the mask—are very low, since only individual masks need to be generated, instead of a complete set of masks. The area overhead of the FPGA is also not required, since the change in the function does not increase the area via transfer circuits between arbitrary nodes.

Finally, the function expansion may take place substantially later and faster as compared to conventional circuit layouts. Throughout the considerable duration of relevant development projects, which may be a full five years up to series production of the resultant circuit, such requirements may be implemented according to the present invention by way of a hardware adaptation. In this way, the substitute adaptation or supplementation of software—including the inherent disadvantage of a less efficient design of the subsequent circuit functions—may be avoided.

Advantageous refinements of and improvements on the present invention are described herein. In this way, it may be provided that the method provided here is utilized within the scope of the microcontroller development. A corresponding microcontroller (μC) may also be adapted, with respect to its performance and equipment, to highly diverse applications after the tape-out. A generic timer module (GTM) of the type, for example, required within the scope of a motor electronics system for controlling actuators and for reading in sensors, may therefore be in the form of multiple Ethernet controllers or other interfaces in an entirely different area of application including the same circuitry parts, which are merely interconnected differently by way of a mask. The different requirements of different applications may be implemented more cost-effectively in this way, without the need to implement all requirements of all applications together.

The advantages of the method become clear on the basis of the function expansion of a microcontroller in one area of application: in this way, in 28-nanometer technology, approximately 1.5 million transistor gates may be implemented on a surface area of one square millimeter of the semiconductor substrate. Assuming a complexity of approximately 20,000 transistors of a single CAN module, approximately ten such CAN interfaces may therefore be implemented on an exemplary surface area of one-seventh of a square millimeter.

New functions may be provided during the product life cycle by changing the mask from the logic of the 200,000 transistors utilized for this purpose, without these exact functions being needed at the time of design.

Exemplary embodiments of the present invention are shown in the figures and are described in greater detail below.

DETAILED DESCRIPTION OF THE PRESENT INVENTION

One specific embodiment of the method provided will now be described on the basis of a comparison of FIGS. 1 and 2 which show two alternative unfinished states 10, 20 of a microcontroller structured in 28-nanometer technology.

Figure 1:
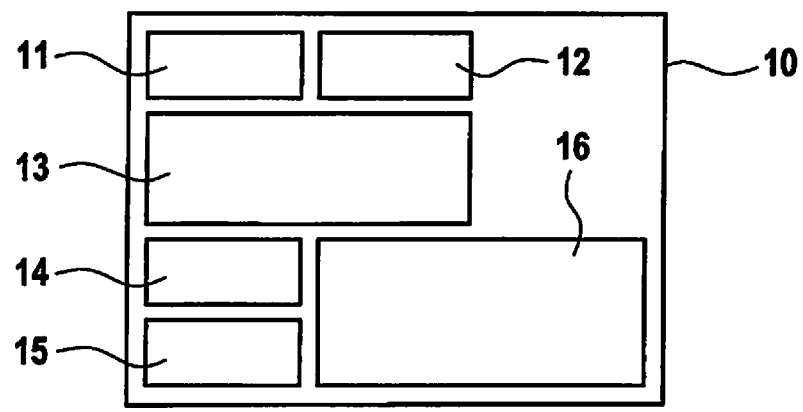
FIG. 1 schematically shows the unfinished state of a microcontroller during the initial tape-out, the circuit layout of which was synthesized according to one specific embodiment.
Figure 3:
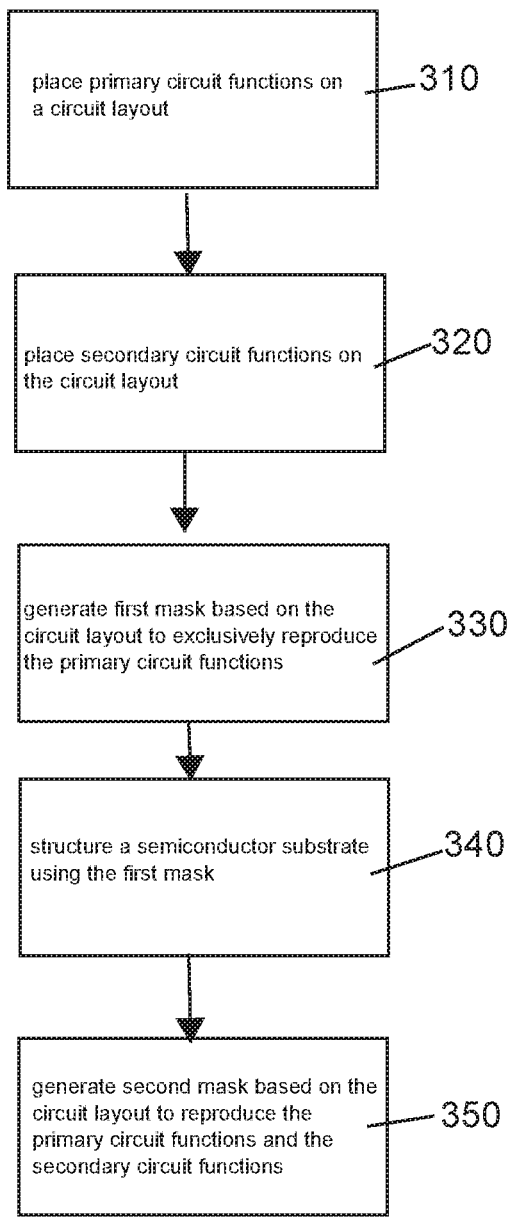
FIG. 3 shows an example method according to the present invention.

As is clearly apparent in FIG. 1, two processor cores 11, 12, 21, 22, one flash EEPROM 14, 24, and a random-access memory 15, 25 (RAM) have been placed, as primary circuit functions 11, 12, 13, 14, 15, 21, 22, 23, 24, 25, on the circuit layout of this microcontroller. (FIG. 3, step 310) Primary circuit functions 11, 12, 13, 14, 15, 21, 22, 23, 24, 25 also include peripheral functions 13, 23 of a serial peripheral interface (SPI) and of a CAN controller.

In addition to aforementioned primary circuit functions 11, 12, 13, 14, 15, 21, 22, 23, 24, 25, the logic for 20 further CAN controllers was placed on a surface area (FIG. 1, element 16) of one-seventh of a square millimeter, which is used only for secondary circuit functions 27, 28, 29, 30, 31 which are not yet required during the initial tape-out. (FIG. 3, step 320) The first mask, which corresponds to the unfinished state 10 from FIG. 1, was generated in such a way that it exclusively reproduces primary circuit functions 11, 12, 13, 14, 15, 21, 22, 23, 24, 25. (FIG. 3, step 330) Secondary circuit functions 27, 28, 29, 30, 31, however, are interconnected in the same step as CAN nodes (this has the advantage that this logic may also be tested before the restructuring, in order to rule out side effects and to have a sufficient number of circuitry parts in the layout for the test)

when the underlying semiconductor substrate is structured (FIG. 3, step 340) according to the circuit layout by way of the first mask.

Figure 2:
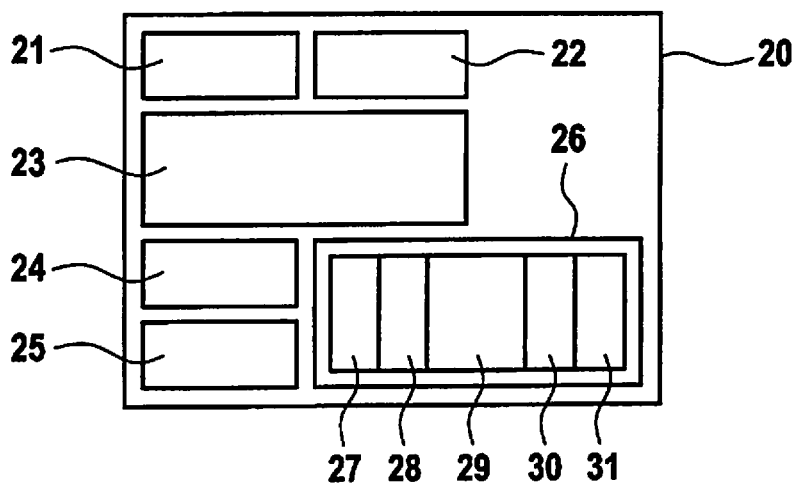
FIG. 2 shows the unfinished state of the microcontroller after its function adaptation.

The outcome is different after the functional adaptation of the microcontroller brought about by changing the mask (FIG. 3, step 350), as FIG. 2 shows: in this case, the semiconductor substrate was structured according to the same circuit layout, although by way of a second, changed mask. Due to this adaptation, secondary circuit functions 28, 29, 30, 31 are present, in addition to an appropriate reserve 27 for further new functions. Surface area 26 corresponds to surface area 16 in FIG. 1.

It should be noted that, according to the present invention, not only are cells reserved for troubleshooting or implementing engineering change orders (ECO). Rather, there is substantially more logic in a complex interconnection, which facilitates a subsequent implementation of a functional, testable circuit on the basis of the interconnection by changing the mask.

What is claimed is:

1. A method for synthesizing a circuit layout, comprising:
   placing primary circuit functions on the circuit layout;
   placing secondary circuit functions on the circuit layout;
   after the placing of the primary circuit functions and the placing of the secondary circuit functions, generating, using the circuit layout which includes the primary circuit functions and the secondary circuit functions, at least one first mask, the first mask configured to reproduce the primary circuit functions and not the secondary circuit functions;
   after the generating of the first mask, structuring a first semiconductor substrate using the first mask to implement, on the first semiconductor substrate, the primary circuit functions and not the secondary circuit functions; and
   after the generating of the first mask, generating, using the circuit layout which includes the primary circuit functions and the secondary circuit functions, at least one second mask, the second mask configured to reproduce the primary circuit functions and the secondary circuit functions.

2. The method as recited in claim 1, wherein the placement of the primary circuit functions includes the placement of at least one processor core, the placement of the primary circuit functions includes the placement of at least one peripheral function, the at least one peripheral function being a serial peripheral interface or a CAN controller, and the placement of the primary circuit functions includes the placement of at least one memory.

3. The method as recited in claim 2, wherein the placement of the memory includes the placement of an electrically erasable programmable read-only memory including a flash EEPROM, and the placement of the memory includes the placement of a random-access memory.

4. The method as recited in claim 1, wherein the placement of the secondary circuit functions includes the placement of at least one peripheral function, the at least one peripheral function including a serial peripheral interface or a CAN controller, and the placement of the secondary circuit functions includes the placement of interconnected basic CMOS-synthesis gates.

5. The method as recited in claim 4, wherein the placement of the basic CMOS-synthesis gates includes the placement of at least one of the following elements: (i) a NOT gate, (ii) a NAND gate, (iii) a NOR gate, (iv) a state-controlled flip-flop, in particular a D-latch, and (v) a pulse edge controlled flip-flop, the pulse edge controlled flip-flop including a register.

6. The method as recited in claim 1, wherein the secondary circuit functions include logic for a CAN controller.

7. A non-transitory machine-readable memory medium on which is stored a computer program for synthesizing a circuit layout, the computer program, when executed by a processor, causing the processor to perform:
   placing primary circuit functions on the circuit layout;
   placing secondary circuit functions on the circuit layout;
   after the placing of the primary circuit functions and the placing of the secondary circuit functions, generating, using the circuit layout which includes the primary circuit functions and the secondary circuit functions, at least one first mask, the first mask configured to reproduce the primary circuit functions and not the secondary circuit functions;
   after the generating of the first mask, structuring a first semiconductor substrate using the first mask to implement, on the first semiconductor substrate, the primary circuit functions and not the secondary circuit functions; and
   after the generating of the first mask, generating, using the circuit layout which includes the primary circuit functions and the secondary circuit functions, at least one second mask, the second mask configured to reproduce the primary circuit functions and the secondary circuit functions.

8. The non-transitory machine-readable memory medium as recited in claim 7, wherein the secondary circuit functions include logic for a CAN controller.

\* \* \* \* \*